US 12,107,986 B2

United States Patent
Kang et al.

(10) Patent No.: US 12,107,986 B2
(45) Date of Patent: Oct. 1, 2024

(54) ELECTRONIC DEVICE EQUIPPED WITH ACCESSORY COVER AND METHOD THEREFOR

(71) Applicant: SAMSUNG ELECTRONICS CO., LTD., Suwon-si (KR)

(72) Inventors: Namhyun Kang, Suwon-si (KR); Minah Koh, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 18/372,040

(22) Filed: Sep. 22, 2023

(65) Prior Publication Data

US 2024/0031471 A1    Jan. 25, 2024

Related U.S. Application Data

(63) Continuation of application No. PCT/KR2022/003539, filed on Mar. 14, 2022.

(30) Foreign Application Priority Data

Mar. 23, 2021 (KR) .................. 10-2021-0037065

(51) Int. Cl.
*H04M 1/72454* (2021.01)
*G06F 3/0354* (2013.01)

(52) U.S. Cl.
CPC .... *H04M 1/72454* (2021.01); *G06F 3/03542* (2013.01)

(58) Field of Classification Search
CPC .............. H05K 5/03; H04M 1/724092; H04M 1/72454; H04M 1/185; H04M 2250/22;
(Continued)

(56) References Cited

U.S. PATENT DOCUMENTS 9,735,825 B2 *  8/2017  Lee ..................... H04B 1/3888
10,056,933 B2 *  8/2018  Lee ..................... G06F 1/1632
(Continued)

FOREIGN PATENT DOCUMENTS

KR    20130045111 A    5/2013
KR    20140096893 A    8/2014
(Continued)

OTHER PUBLICATIONS

International Search Report and Written Opinion for International Application No. PCT/KR2022/003539; International Filing Date Mar. 14, 2022; Date of Mailing Jun. 20, 2022; 56 Pages.

*Primary Examiner* — Vinh T Lam
(74) *Attorney, Agent, or Firm* — CANTOR COLBURN LLP

(57) ABSTRACT

An electronic device includes a communication module for communication with an accessory cover including a first cover and a second cover, at least one sensor module, a display module, a memory and a processor operatively connected to the communication module, the at least one sensor module, the display module, and the memory. The processor may detect mounting of the accessory cover through the communication module, check sensing information regarding the first cover and the second cover by using the at least one sensor module, and change, on the basis of the sensing information, configuration information for the display module when the first cover is open and the second cover is closed.

20 Claims, 10 Drawing Sheets

(58) Field of Classification Search
CPC ... G06F 3/03542; G06F 3/03545; A45C 11/00
See application file for complete search history.

(56) References Cited

U.S. PATENT DOCUMENTS

| | | | |
|---|---|---|---|
| 10,547,716 B2* | 1/2020 | Jeon | G06F 3/044 |
| 10,707,912 B2* | 7/2020 | Kim | H04M 1/0254 |
| 10,852,858 B2* | 12/2020 | Paik | G06F 3/04162 |
| 11,023,072 B2* | 6/2021 | Choi | G06F 3/03545 |
| 11,870,922 B2* | 1/2024 | Lee | G06F 3/1431 |
| 2014/0198070 A1* | 7/2014 | Won | H04M 1/04 345/173 |
| 2014/0210803 A1 | 7/2014 | Oh et al. | |
| 2015/0186093 A1* | 7/2015 | Kim | G06F 1/1677 345/174 |
| 2016/0054759 A1 | 2/2016 | Lee et al. | |
| 2017/0017391 A1 | 1/2017 | Hong et al. | |
| 2017/0244823 A1* | 8/2017 | Kim | H04B 5/72 |
| 2019/0064885 A1* | 2/2019 | Paik | G06F 1/1632 |
| 2020/0264753 A1* | 8/2020 | Choi | G06F 3/03545 |
| 2021/0223828 A1* | 7/2021 | Kwon | H04M 1/72454 |
| 2022/0030099 A1* | 1/2022 | Park | H02J 7/0044 |

FOREIGN PATENT DOCUMENTS

| | | |
|---|---|---|
| KR | 101512364 B1 | 4/2015 |
| KR | 20150103955 A | 9/2015 |
| KR | 20150107502 A | 9/2015 |
| KR | 101560389 B1 | 10/2015 |
| KR | 20150111701 A | 10/2015 |
| KR | 20160002188 A | 1/2016 |
| KR | 20160023471 A | 3/2016 |
| KR | 20170007940 A | 1/2017 |
| KR | 20170098124 A | 8/2017 |
| KR | 102046353 B1 | 12/2019 |
| KR | 102147950 B1 | 8/2020 |
| KR | 20200100929 A | 8/2020 |

* cited by examiner

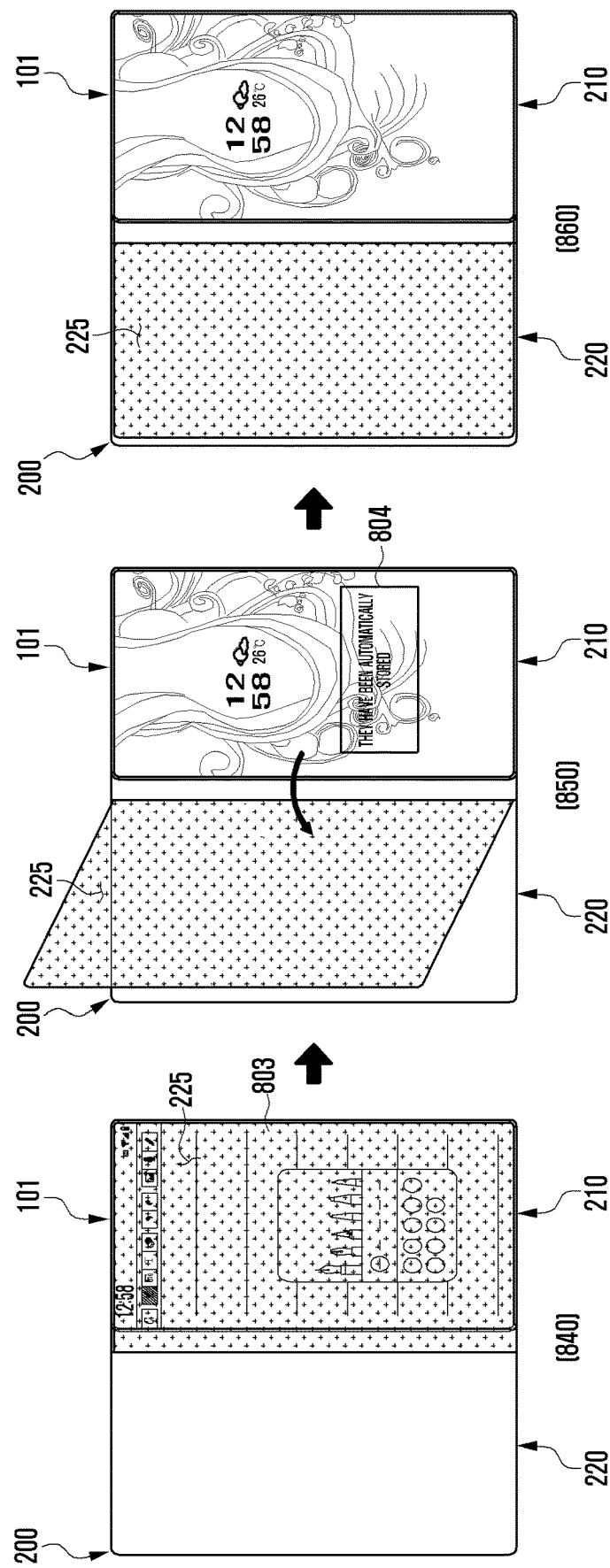

US 12,107,986 B2

ELECTRONIC DEVICE EQUIPPED WITH ACCESSORY COVER AND METHOD THEREFOR

CROSS-REFERENCE TO RELATED APPLICATIONS

This application is a continuation application, claiming priority under § 365(c), of International Application No. PCT/KR2022/003539, filed on Mar. 14, 2022, which is based on and claims the benefit of Korean patent application number 10-2021-0037065, filed on Mar. 23, 2021, in the Korean Intellectual Property Office, the disclosures of which are incorporated by reference herein in their entireties.

TECHNICAL FIELD

Various embodiments of the disclosure relate to an electronic device equipped with an accessory cover, and a method therefor.

BACKGROUND ART

The development of electronic devices may be applied to various fields which are close to our lives. Such electronic devices have been released with various sizes depending on their functions and user preferences. A housing forming an exterior of an electronic device or an accessory device (e.g., protection housing or protection cover) separately equipped on the electronic device to protect at least a partial area of the electronic device has been mounted on the electronic device.

DISCLOSURE OF INVENTION

Technical Problem

With the development of technology, a display of an electronic device may be expanded to provide a wider screen to a user. As the display of the electronic device is expanded, usability of an electronic pen has been increased, and various films for improving handwriting feelings of the electronic pen may be attached onto the display of the electronic device. In general, in case that a film is attached onto the display of the electronic device, the handwriting feelings for the electronic pen may be improved, but there may be a problem in that screen resolution through the display may be degraded.

According to an embodiment, an accessory cover may be equipped on an electronic device to protect the exterior of the electronic device against external impacts. For example, the accessory cover may include a front cover for protecting a display disposed on a front surface of the electronic device and a rear cover for protecting a rear surface of the electronic device that is opposite to the front cover.

According to various embodiments, an accessory cover may include an inner cover for improving the handwriting feelings of an electronic pen. According to an embodiment of the disclosure, an electronic device equipped with the accessory cover may be provided.

Solution to Problem

According to various embodiments, an electronic device may include a communication module configured for communication with an accessory cover including a first cover and a second cover, at least one sensor module, a display module, a memory, and a processor operatively connected to the communication module, the at least one sensor module, the display module, and the memory. The processor may detect an equipment for the accessory cover through the communication module, identify sensing information on the first cover and the second cover by using the at least one sensor module, and change configuration information on the display module in case that the first cover is in an open state and the second cover is in a closed state based on the sensing information.

According to various embodiments, a method may include detecting an equipment for an accessory cover through a communication module, identifying sensing information on a first cover and a second cover included in the accessory cover by using at least one sensor module and changing configuration information on a display module in case that the first cover is in an open state and the second cover is in a closed state based on the identified sensing information.

Advantageous Effects of Invention

According to various embodiments, it is possible to additionally implement an inner cover having improved handwriting feelings of an electronic pen and having a paper texture on an accessory cover. When the electronic pen is used, the inner cover can be attached to a display of an electronic device at least partly, and thus usability of the electronic pen can be improved. For example, the electronic device may execute an application related to the usage of the electronic pen, or may change configuration information on a display module. When the electronic pen is not in use, the inner cover can be removed from the display of the electronic device, and thus a user environment in which screen resolution is not degraded can be provided to a user.

According to an embodiment, the electronic device can detect whether the inner cover included in the accessory cover has been attached to the display, and can change the configuration information on the display in response to a situation in which the inner cover has been attached to the display. In addition, various effects that can be directly or indirectly grasped through this document can be provided.

BRIEF DESCRIPTION OF DRAWINGS

In relation to the description of the drawings, the same or similar reference numerals may be used for the same or similar constituent elements.

FIG. 8B is a plan view showing an embodiment of storing a memo being written in case that an inner cover of an accessory cover is removed from a display of an electronic device according to various embodiments.

MODE FOR THE INVENTION

Figure 1:
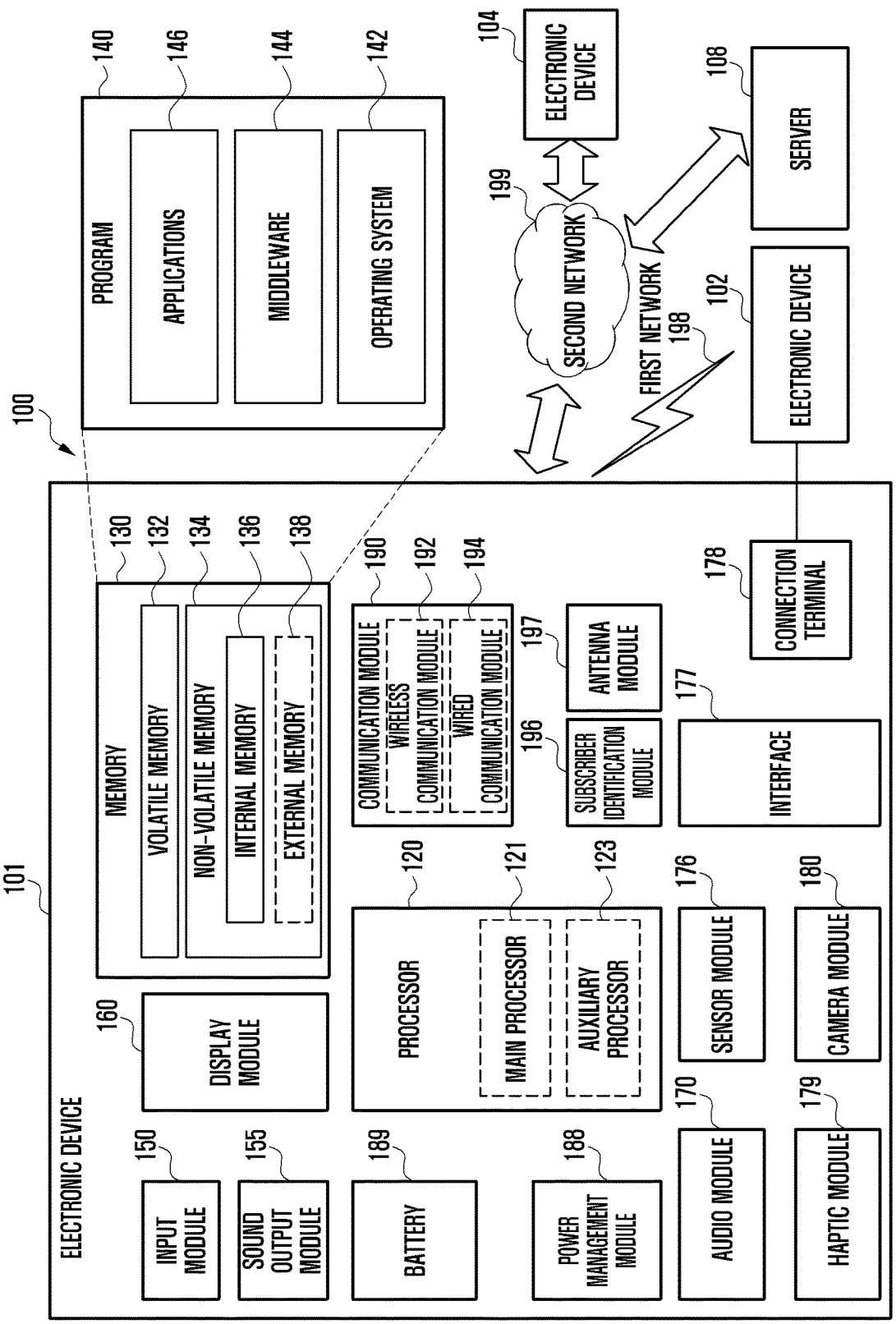
FIG. 1 is a block diagram of an electronic device in a network environment according to various embodiments.

Hereinafter, various embodiments of the disclosure are described with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 illustrates an electronic device in a network environment according to an embodiment of the disclosure. Referring to FIG. 1, an electronic device 101 in a network environment 100 may communicate with an electronic device 102 via a first network 198 (e.g., a short-range wireless communication network), or at least one of electronic device 104 or a server 108 via a second network 199 (e.g., a long-range wireless communication network). The electronic device 101 may communicate with the electronic device 104 via the server 108. The electronic device 101 includes a processor 120, memory 130, an input module 150, an audio output module 155, a display module 160, an audio module 170, a sensor module 176, an interface 177, a connecting terminal 178, a haptic module 179, a camera module 180, a power management module 188, a battery 189, a communication module 190, a subscriber identity module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 or external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The audio output module 155 may output sound signals to the outside of the electronic device 101. The audio output module 155 may include, for example, a speaker or a receiver. The speaker may be used for general purposes, such as playing multimedia or playing record. The receiver may be used for receiving incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include a touch sensor adapted to detect a touch, or a pressure sensor adapted to measure the intensity of force incurred by the touch.

The audio module 170 may convert a sound into an electrical signal and vice versa. The audio module 170 may obtain the sound via the input module 150, or output the sound via the audio output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). The connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, image signal processors, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or a standard of the Infrared Data Association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. The antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 or 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
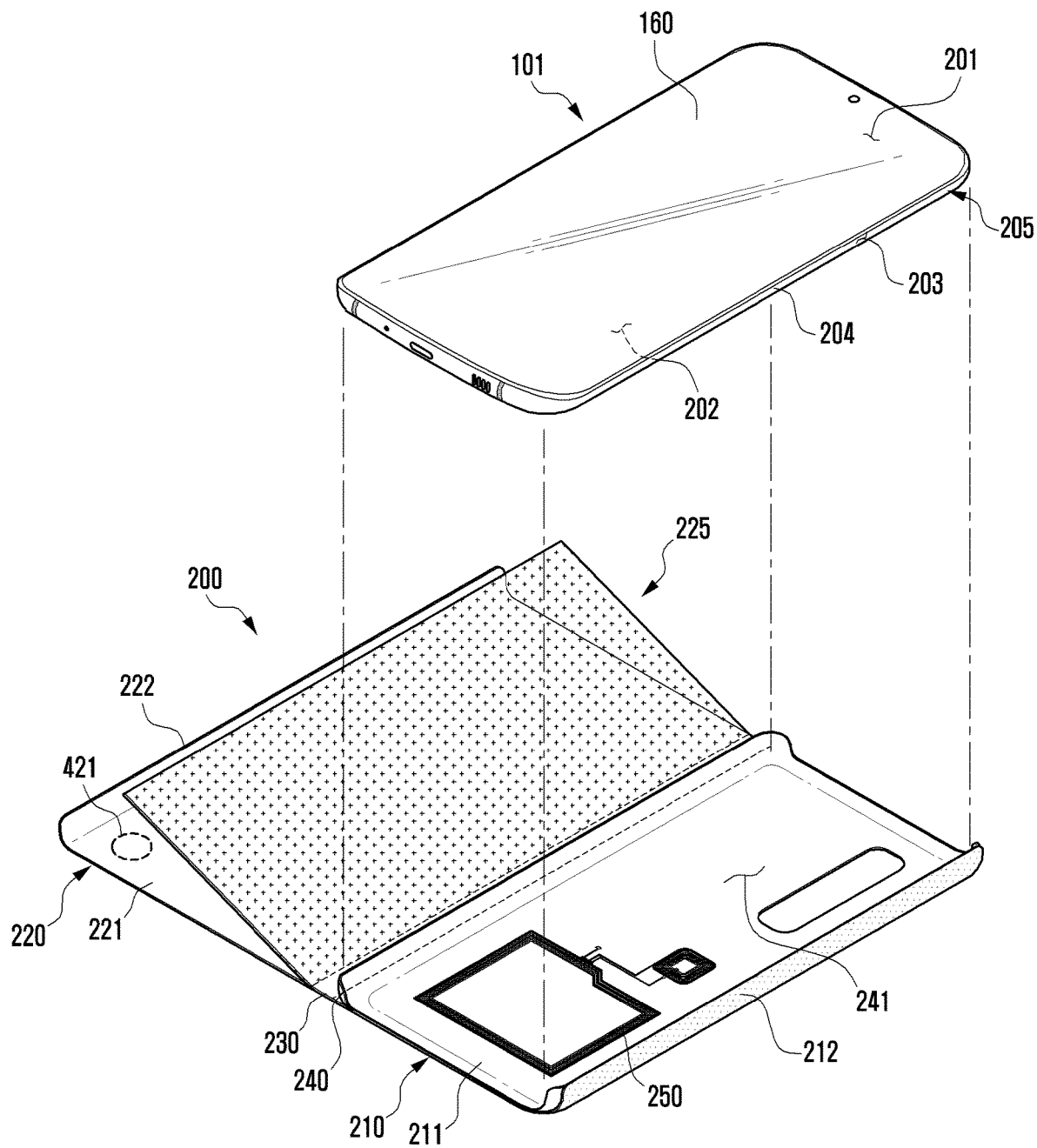
FIG. 2 is an exploded perspective view of an accessory cover and an electronic device equipped thereon according to various embodiments.
Figure 3:
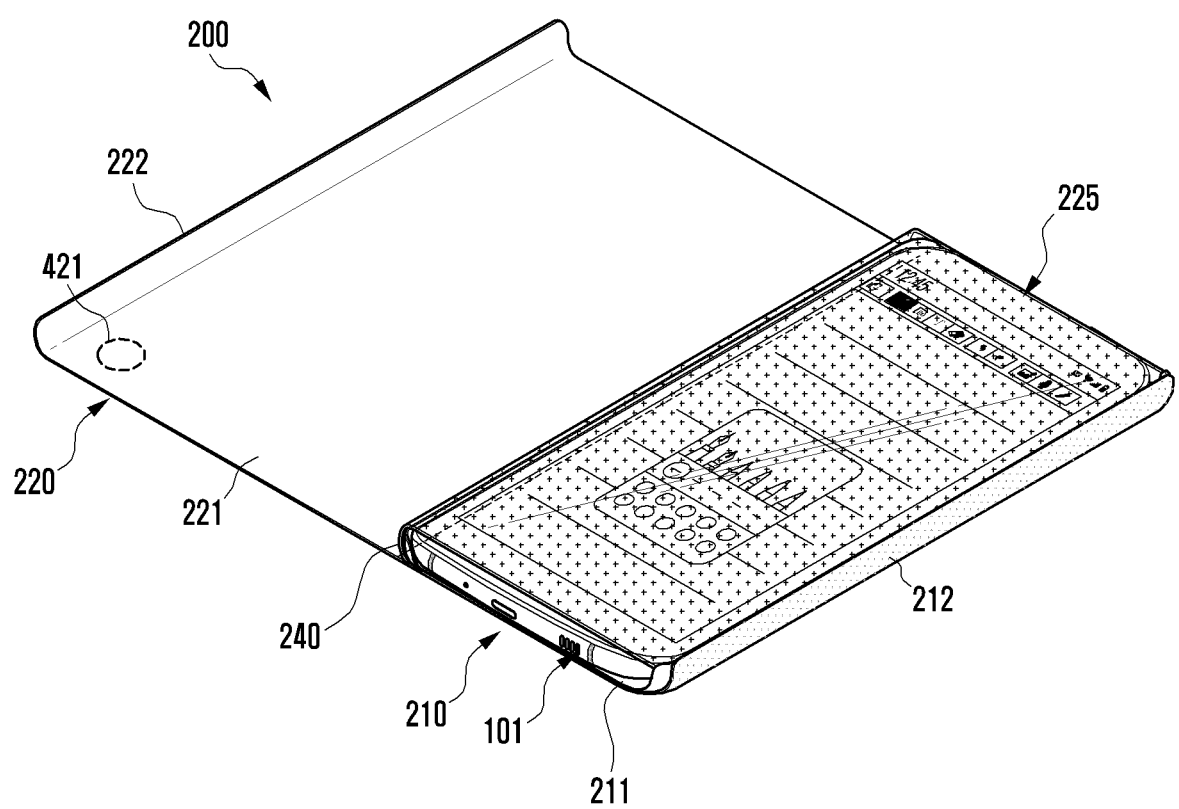
FIG. 3 is a perspective view illustrating a state in which an inner cover of an accessory cover is attached to a display of an electronic device according to various embodiments.

FIG. 2 is an exploded perspective view of an accessory cover and an electronic device equipped thereon according to various embodiments. FIG. 3 is an perspective view illustrating a state in which an inner cover of an accessory cover is attached to a display of an electronic device according to various embodiments.

According to an embodiment and with reference to FIGS. 2 and 3, an accessory cover 200 may include a first cover 210 (e.g., rear cover), a second cover 220 (e.g., front cover), a third cover 225 (e.g., inner cover), and a connection part 230 integrally connecting the first cover 210 and the second cover 220 with each other. For example, the third cover 225 may be implemented in the form of being at least partly attached to the connection part 230. According to an embodiment, the first cover 210, the second cover 220, and/or the third cover 225 may be formed with substantially the same size.

According to an embodiment, the first cover 210 may include a first plate part 211 and a first side part 212 extending from at least a part of an edge of the first plate part 211 in a vertical direction. According to an embodiment, the first side part 212 may be formed in a shape corresponding to at least a part of a side surface 203 of an electronic device 101 (e.g., electronic device 101 of FIG. 1). According to an embodiment, the electronic device 101 may be equipped with the accessory cover 200 in the form in which a rear surface of the electronic device 101 is disposed corresponding to the first cover 210.

According to an embodiment, the second cover 220 may include a second plate part 221 and a second side part 222 extending from at least a part of an edge of the second plate part 221 in a vertical direction. According to an embodiment, the second side part 222 may also be formed in a shape corresponding to at least a part of the side surface 203 of the electronic device 101. According to another embodiment, the first side part 212 and the second side part 222 may be formed in a curved shape. According to an embodiment, the second cover 220 may include at least one magnetic member (e.g., magnet). According to an embodiment, on the electronic device 101, a sensor module (e.g., sensor module 176, hall sensor, and hall IC) may be disposed corresponding to the location of a magnetic member (e.g., first magnetic member 421 of FIG. 4) disposed on the second cover 220. According to an embodiment, the disposition location and the number of magnetic members are not limited. For example, the electronic device 101 may detect the magnetic member 421 included in the second cover 220 through the sensor module 176, and may identify whether the second cover is in an open state or in a closed state. For example, the closed state may be a state in which the second cover 220 covers a display module (e.g., display module 160 of FIG. 1) of the electronic device 101, and the open state may be a state in which the second cover 220 does not cover the display module 160. The electronic device 101 in the open state may be in a state in which the display module 160 is exposed to an outside, and may detect a user's touch input through the display module 160. According to an embodiment, the electronic device 101 may detect the magnetic member 421 through a sensor module 176, and may identify whether the second cover 220 is in the open state or in the closed state. The electronic device 101 may perform at least one function corresponding to the state of the second cover 220.

According to an embodiment, the third cover 225 may be disposed between the first cover 210 and the second cover 220, and may be implemented in the form of being at least partly attached to an edge (e.g., an area in which the second cover 220 and the connection part 230 are connected with each other) of the connection part 230. According to an embodiment, the third cover 225 may be disposed in the form of at least partly covering the display module 160 of the electronic device 101. For example, the third cover 225 may be implemented in the form of a film having a paper texture. The third cover 225 may be transparently and/or translucently implemented based on at least one material of thermos plastic polyurethane (TPU), polycarbonate (PC), and silicone. For example, the third cover 225 may be implemented by injection by using at least one of the above-described materials. The third cover 225 may be implemented so that the surface thereof has a paper texture (e.g., haze texture) through adjustment of the injection strength. According to an embodiment, the third cover 225 may be attached to the display module 160 of the electronic device 101, and may improve handwriting feelings for an electronic pen. For example, when a user writes on the display module 160 covered by the third cover 225 using the electronic pen, the user may have the handwriting feelings like handwriting on a paper. According to an embodiment, since the third cover 225 is implemented transparently and/or translucently, the electronic device 101 may provide a user interface to the user through the display module 160.

According to an embodiment, the third cover 225 may include at least one magnetic member (e.g., magnet). For example, the at least one magnetic member may be disposed at a location that does not hide the display module 160, such as an edge of the third cover 225. For example, when the second cover 220 and the third cover 225 are attached to each other, the magnetic member disposed on the third cover 225 and the magnetic member disposed on the second cover 220 may be disposed to be away from each other by a predetermined distance. According to an embodiment, the electronic device 101 may sense the at least one magnetic member by using the sensor module (e.g., sensor module 176 of FIG. 1, hall sensor, or hall IC), and may determine whether the third cover 225 is attached to the display module 160. According to an embodiment, the sensor module 176 may include a first hall sensor for sensing the magnetic member disposed on the second cover 220 and a second hall sensor for sensing the magnetic member disposed on the third cover 225. The first hall sensor and the second hall sensor may independently sense the magnetic members. The electronic device 101 may identify the open state and/or the closed state of the second cover 220 by using the first hall sensor, and may identify the open state and/or the closed state of the third cover 225 by using the second hall sensor.

According to an embodiment, the electronic device 101 may perform at least one function in response to one case among a first case that the second cover 220 and the third cover 225 are in the closed state together, a second case that the second cover 220 is in the open state, and only the third cover 225 is in the closed state, and/or a third case that the second cover 220 and the third cover 225 are in the open state together. For example, in response to the second case that only the third cover 225 is in the closed state, the electronic device 101 may execute at least one application related to the electronic pen, and/or may change configuration information (e.g., color, brightness (e.g., brightness of color), contrast, balance, saturation, and/or sharpness) of the display module 160.

According to an embodiment, different magnetic members (e.g., additional magnetic members) may be disposed at substantially the same locations of the second cover 220 and the third cover 225. For example, in case that a magnetic generation member is disposed on the second cover 220, a magnetic response member may be disposed on the third cover 225, and in case that the magnetic generation member is disposed on the third cover 225, the magnetic response member may be disposed on the second cover 220. According to an embodiment, the second cover 220 and the third cover 225 may maintain a mutual attachment state through the different magnetic members. For example, in case that the user changes the state of the second cover 220 of the accessory cover 200 to the open state to use the electronic device 101, the second cover 220 and the third cover 225 in the mutual attachment state may be changed to the open state together. According to an embodiment, when the user uses the electronic pen in a state in which the second cover 220 and the third cover 225 have been changed to the open state together, the electronic device 101 may change only the third cover 225 to the closed state, and may receive a handwriting input through the electronic pen.

According to various embodiments, the accessory cover 200 may include a cradle 240 attached to the first plate part 211 of the first cover 210. According to an embodiment, the cradle 240 may include an equipment part 241 configured to accommodate a rear surface 202 and at least a part of a side surface 203 of the electronic device 101. According to an embodiment, the cradle 240 may be formed of a polymer and/or a metal material. For example, the cradle 240 may be formed of at least one material of a metal material, GFRP, CFRP, rubber, silicone, PC, PC_ABS, or PC_FG. According to an embodiment, the electronic device 101 may be at least partly equipped with the accessory cover 200 based on the cradle 240, the equipment part 241, and the first side part 212. The electronic device 101 may be at least partly fixed to the accessory cover 200. According to an embodiment, at least one hall sensor may be disposed on a side member 204 of the electronic device 101 corresponding to the cradle 240. For example, in the closed state, the third cover 225 of the accessory cover 200 may come in contact with the cradle 240 at least partly, and the electronic device 101 may detect the closed state of the third cover 225 through the at least one hall sensor.

According to various embodiments, the electronic device 101 may include a housing 205 (e.g., housing structure) including the side member 204 including a front surface 201 directed in a designated direction, the rear surface 202 directed in an opposite direction to the direction of the front surface 201, and the side surface 203 surrounding a space between the front surface 201 and the rear surface 202. According to an embodiment, the electronic device 101 may include the display module 160 disposed so as to be seen from an outside substantially through the overall area of the front surface 201.

According to various embodiments, the first cover 210 of the accessory cover 200 may accommodate at least a part of the electronic device 101. According to an embodiment, the electronic device 101 may be fixed in a manner of being equipped with the equipment part 202 of the cradle 240 disposed on the first plate part 211 of the first cover 210. For example, the electronic device 101 may be fixed to the accessory cover 200 by making the rear surface 202 of the electronic device 101 face the equipment part 241 of the cradle 240 and tightly inserting at least a part of the side surface 203 into the cradle 240. According to an embodiment, an NFC antenna 250 may be at least partly disposed on the first cover 210 of the accessory cover 200, and the electronic device 101 may identify whether the electronic device 101 is equipped with the accessory cover 200 through the NFC antenna 250. For example, in a state that the NFC antenna is mounted, the electronic device 101 may detect the NFC antenna 250 of the first cover 210, and depending on the detection/non-detection, the electronic device 101 may identify whether the electronic device 101 is equipped with the accessory cover 200 and/or an authentication (e.g., authentication of whether the accessory cover 200 is genuine) for the accessory cover 200.

According to an embodiment, when the electronic device 101 is not in use or is being carried, the second cover 220 and the third cover 225 may be folded in the form of covering the display module 160 of the electronic device 101, and the electronic device 101 may maintain the first case (e.g., the second cover 220 is in the closed state, and the third cover 225 is in the closed state) for protecting the display module 160. When the electronic device 101 is in use, the second cover 220 and the third cover 225 may maintain the third case (e.g., the second cover 220 is in the open state, and the third cover 225 is in the open state) for exposing the display module 160 of the electronic device 101 to an outside. According to an embodiment, in case of using an electronic pen on the electronic device 101, the electronic device 101 may maintain the second case (e.g., the second cover 220 is in the open state, and the third cover 225 is in the closed state) that is the closed state in which the third cover 225 covers the display module 160. According to an embodiment, in the case of using the electronic pen, the electronic device 101 may obtain a handwriting input using the electronic pen on the third cover 225, while maintaining the second case. According to another embodiment, the electronic device 101 may perform at least a partial function through a notification means 223 (e.g., notification member) disposed on the second cover 220 in the first case (e.g., the second cover 220 is in the closed state, and the third cover 225 is in the closed state). For example, the notification means may provide a specific notification to a user through a control circuit including an LED indicator built in the second cover 220. According to an embodiment, the control circuit including the notification means 223 may be wirelessly and/or wiredly connected to the electronic device 101, and thus may be provided with data and a power source.

According to an embodiment, the second cover 220 and the third cover 225 of the accessory cover 200 may include at least one magnetic member (e.g., magnet) for being at least partly attached to the electronic device 101. At least one hall sensor may be disposed on the electronic device 101 corresponding to locations where the magnetic member of the second cover 220 and the magnetic member of the third cover 225 are disposed. According to an embodiment, the electronic device 101 may detect the open state and/or the closed state of at least one of the second cover 220 and the third cover 225.

According to an embodiment, the electronic device 101 may identify the open state and/or the closed state of a plurality of covers (e.g., second cover 220 and/or third cover 225) included in the accessory cover 200. For example, the electronic device 101 may discriminate and detect at least one of the first case that the second cover 220 and the third cover 225 are all in the closed state, the second case that the second cover 220 is in the open state, and only the third cover 225 is in the closed state, and/or the third case that the second cover 220 and the third cover 225 are all in the open state. According to an embodiment, the electronic device 101 may operate in a low power mode in response to the first case, may operate in an electronic pen mode for using the electronic pen in response to the second case, and may operate in a normal mode for a touch input by a hand in response to the third case. According to an embodiment, in case of operating in the electronic pen mode (e.g., second case), the electronic device 101 may execute at least one function (e.g., note application, electronic pen related program, and/or electronic pen related menu) related to the usage of the electronic pen. According to another embodiment, in case of operating in the electronic pen mode (e.g., second case), the electronic device 101 may at least partly change configuration information (e.g., color, brightness (e.g., brightness of color), contrast, balance, saturation, and/or sharpness) of the display module 160. For example, in the second case that the display module 160 is covered only by the third cover 225, the resolution of the display module 160 visually shown to the user may be degraded. According to an embodiment, the electronic device 101 may at least partly change the configuration information on the display module 160 so that the resolution of the display module 160 is shown not to be degraded when the third cover 225 is in the closed state. According to various embodiments, in case of operating in the electronic pen mode (e.g., second case), the electronic device 101 may perform at least one of executing at least one function related to the usage of the electronic pen or changing the configuration information on the display module 160.

According to another embodiment, the electronic device 101 may be at least partly equipped with the accessory cover composed of a single cover, and may identify the open state and/or the closed state of the single cover. For example, the single cover may include a film form having a paper texture, and/or may be implemented transparently and/or translucently. When the single cover is put on the display module 160 (e.g., when the single cover is in the closed state), the electronic device may have improved handwriting feelings, and may include at least one magnetic member. The electronic device 101 may identify the closed state of the single cover by detecting the magnetic member included in the single cover, and in response to the closed state of the single cover, the electronic device 101 may perform at least one operation of executing at least one function (e.g., note application, electronic pen related program, or electronic pen related menu) related to the usage of the electronic pen, and/or changing configuration information (e.g., color, brightness (e.g., brightness of color), contrast, balance, saturation, and/or sharpness) of the display module 160.

Figure 4:
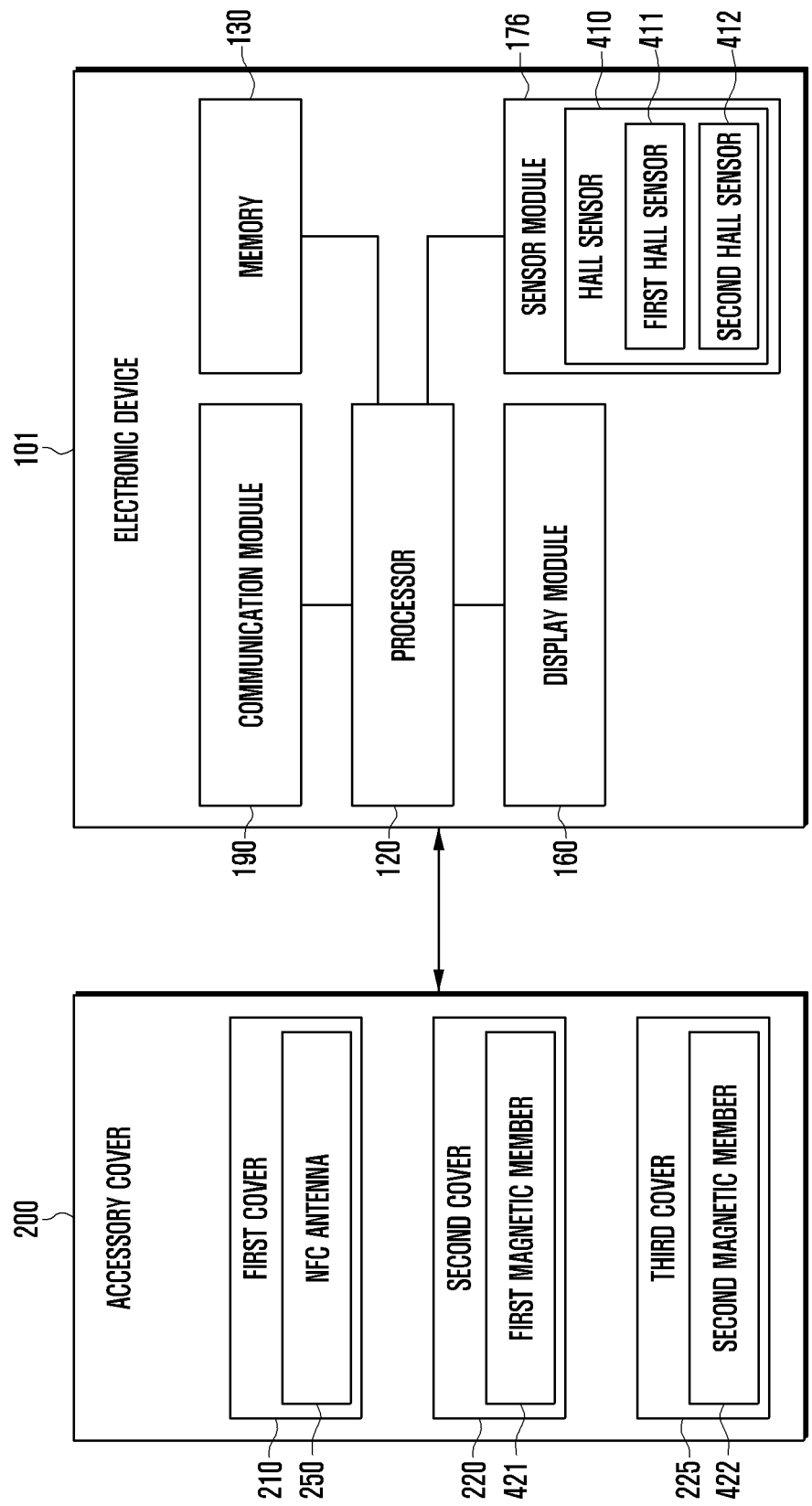
FIG. 4 is a block diagram of an electronic device and an accessory cover according to various embodiments.

FIG. 4 is a block diagram of an electronic device and an accessory cover according to various embodiments of the disclosure.

In an embodiment and with reference to FIG. 4, an electronic device (e.g., electronic device 101 of FIG. 1) may include a processor (e.g., processor 120 of FIG. 1), a memory (e.g., memory 130 of FIG. 1), a display module (e.g., display module 160 of FIG. 1), a sensor module (e.g., sensor module 176 of FIG. 1), and/or a communication module (e.g., communication module 190 of FIG. 1). Sensor module 176 may include a hall IC (sensor) 410. According to an embodiment, the electronic device 101 may be equipped with an accessory cover 200, and may be operatively connected to the accessory cover 200. The accessory cover 200 may include a plurality of covers (e.g., first cover 210, second cover 220, and/or third cover 225). According to an embodiment, the electronic device 101 may be equipped with the accessory cover 200, and may detect an open state and/or a closed state for at least one cover. The electronic device 101 may execute at least one program and/or may change configuration information on a display module 160 based on the detected state.

According to an embodiment, the processor 120 may control at least one different constituent element (e.g., hardware or software constituent element), and may perform various data processes and/or arithmetic operations by executing a program (e.g., program 140 of FIG. 1) stored in memory 130. For example, the processor 120 may detect the states (e.g., open state and/or closed state) of a plurality of covers constituting the accessory cover 200, and based on the detected states, the processor 120 may perform at least one function (e.g., executing at least one program or changing the configuration information on the display module 160).

According to an embodiment, the memory 130 may store data for performing at least one function in response to the respective states of the plurality of covers constituting the accessory cover 200.

According to an embodiment, the display module 160 may be a constituent part for providing visual information to a user. The display module 160 may display at least one piece of content based on predetermined configuration information (e.g., color, brightness (e.g., brightness of color), contrast, balance, saturation, and/or sharpness). According to an embodiment, the processor 120 may determine activation/deactivation of the display module 160 and/or may change the configuration information of the display module 160 based on the state of the accessory cover 200.

According to an embodiment, the sensor module 176 may include at least one hall sensor 410 (e.g., hall sensor or hall IC) for detecting the state (e.g., open state and/or closed state) of the accessory cover 200. For example, the at least one hall sensor 410 may include a first hall sensor 411 for detecting the state of a second cover 220 of the accessory cover 200, and a second hall sensor 412 for detecting the state of a third cover 225. According to an embodiment, a first magnetic member 421 may be disposed at a location corresponding to the first hall sensor 411 on the second cover 220, and a second magnetic member 422 may be disposed at a location corresponding to the second hall sensor 412 on the third cover 225. The first hall sensor 411 and the second hall sensor 412 may be disposed to be located away from each other by a predetermined distance so that they do not interfere with each other. According to an embodiment, the processor 120 may determine the proximity of the first magnetic member 421 and may identify the state (e.g., open state and/or closed state) of the second cover 220 by using the first hall sensor 411. The processor 120 may determine the proximity of the second magnetic member 422 and may identify the state (e.g., open state and/or closed state) of the third cover 225 by using the second hall sensor 412.

According to an embodiment, the communication module 190 may support the near field communication (NFC) for the accessory cover 200. The communication module 190 may include an NFC antenna (not shown), and may detect an NFC antenna 250 disposed on the first cover 210 of the accessory cover 200. According to an embodiment, the processor 120 may identify whether the electronic device 101 is equipped with the accessory cover 200 through the communication module 190.

According to an embodiment, the processor 120 of the electronic device 101 may identify whether the accessory cover 200 is equipped through the communication module 190, and may detect the respective states (e.g., open state and/or closed state) of a plurality of covers (e.g., second cover 220 and third cover 225) constituting the accessory cover 200 by using the sensor module 176. The processor 120 may execute at least one application stored in the memory 130 based on the states of the second cover 220 and/or the third cover 225, and/or may at least partly change the configuration information on the display module 160.

According to an embodiment, the accessory cover 200 may include a first cover 210 on which the electronic device 101 is equipped with the equipment location of the electronic device 101 being fixed, a second cover 220 configured to protect the display module 160 of the electronic device 101 from an external environment, and/or a third cover 225 configured to improve handwriting feelings for an electronic pen when the electronic pen is used. The third cover 225 may include an inner cover formed between the first cover 210 and the second cover 220.

According to an embodiment, the first cover 210 may include the NFC antenna 250 configured to operatively communicate with the electronic device 101, and may provide information that the electronic device 101 is equipped with the accessory cover 200 to the electronic device 101 through the NFC antenna 250. The second cover 220 may include the first magnetic member 421 disposed corresponding to the first hall sensor 411 of the electronic device 101. The processor 120 may identify the open state and/or the closed state of the second cover 220 through the first hall sensor 411. The third cover 225 may include the second magnetic member 422 disposed corresponding to the second hall sensor 412 of the electronic device 101. The processor 120 may identify the open state and/or the closed state of the third cover 225 through the second hall sensor 412.

According to an embodiment, the electronic device 101 may identify the open state and/or the closed state of each of a plurality of covers (e.g., second cover 220 and/or third cover 225) included in the accessory cover 200 through the at least one hall sensor (e.g., first hall sensor 411 and/or second hall sensor 412). For example, the electronic device 101 may discriminate and detect the first case that the second cover 220 and the third cover 225 are all in the closed state, the second case that the second cover 220 is in the open state, and only the third cover 225 is in the closed state, and/or the third case that the second cover 220 and the third cover 225 are all in the open state. According to an embodiment, the electronic device 101 may operate in the low power mode in response to the first case, may operate in the electronic pen mode for using the electronic pen in response to the second case, and may operate in the normal mode for the touch input by the hand in response to the third case.

According to an embodiment, in case of operating in the electronic pen mode, the electronic device 101 may execute at least one application (e.g., note application) related to the usage of the electronic pen, being stored in the memory 130, and/or at least partly changing the configuration information (e.g., color, brightness (e.g., brightness of color), contrast, balance, saturation, and/or sharpness) of the display module 160. For example, in the second case that the display module 160 is covered only by the third cover 225, the resolution of the display module 160 visually shown to the user may be degraded. According to an embodiment, the electronic device 101 may at least partly change the configuration information (e.g., color, brightness (e.g., brightness of color), contrast, balance, saturation, and/or sharpness) of the display module 160 so that the resolution of the display module 160 is shown not to be degraded when the third cover 225 is in the closed state. According to another embodiment, the sensor module 176 may further include an illumination sensor, and the processor 120 may change the configuration information of the display module 160 based on surrounding brightness information. According to another embodiment, the electronic device 101 may further include a power management module (e.g., power management module 188 of FIG. 1), and may change the configuration information of the display module 160 based on the capacity (e.g., residual capacity) of the battery (e.g., battery 189 of FIG. 1).

According to various embodiments, the electronic device 101 may include the communication module 190 for communication with the accessory cover 200 including the first cover (e.g., outer cover or second cover 220 of FIG. 4) and the second cover (e.g., inner cover or third cover 225), the at least one sensor module 176, the display module 160, the memory 130, and the processor 120 which may be operatively connected to the communication module 190. The processor 120 may detect the equipment for the accessory cover 200 through the communication module 190, identify sensing information on the first cover 220 and the second cover 225 by using the at least one sensor module 176, and change the configuration information on the display module 160 in the case that the first cover 220 is in the open state and the second cover 225 is in the closed state based on the sensing information.

According to an embodiment, the first cover 220 may include the outer cover configured to protect the display module 160 against an external impact, and the second cover 225 may include the inner cover configured to improve the handwriting feelings in the case of using an electronic pen.

According to an embodiment, the second cover 225 may be transparently implemented and may be constructed from at least one material of thermos plastic polyurethane (TPU), polycarbonate (PC), and/or silicone.

According to an embodiment, the second cover 225 may be implemented by injection based on the at least one material so that a surface of the second cover 225 has a paper texture.

According to an embodiment, the at least one sensor module 176 may include the first hall sensor 411 and the second hall sensor 412, and the processor 120 may identify the sensing information on the first cover 220 by using the first hall sensor 411, and may identify the sensing information on the second cover 225 by using the second hall sensor 412.

According to an embodiment, the first magnetic member 421 may be disposed on the first cover 220 corresponding to the first hall sensor 411, and the second magnetic member 422 may be disposed on the second cover 225 corresponding to the second hall sensor 412.

According to an embodiment, additional magnetic members may be disposed at various locations corresponding to the first cover 220 and the second cover 225 so that the first cover 220 and the second cover 225 are attached to each other.

According to an embodiment, the configuration information on the display module 160 may include at least one of color, brightness, contrast, balance, saturation, and sharpness of the display module 160.

According to an embodiment, the processor 120 may execute at least one application stored in the memory 130 and related to the usage of the electronic pen in the case that the first cover 220 is in the open state and the second cover 225 is in the closed state, and may obtain the handwriting input of the electronic pen through the second cover 225.

According to an embodiment, the processor 120 may store the obtained handwriting input in the memory 130 in the case that the first cover 220 is changed to the closed state in a state in which the first cover 220 is in the open state and the second cover 225 is in the closed state.

According to an embodiment, the processor 120 may store the obtained handwriting input in the memory 130 and may display a lock screen through the display module 160 in the case that the second cover 225 is changed to the open state in a state in which the first cover 220 is in the open state and the second cover 225 is in the closed state.

According to an embodiment, the accessory cover 200 may include a short-range communication antenna (e.g., NFC antenna 250 of FIG. 4), and the processor 120 may identify the short-range communication antenna 250 through the communication module 190, and may detect that the short-range communication antenna 250 has been mounted on the accessory cover 200.

Figure 5:
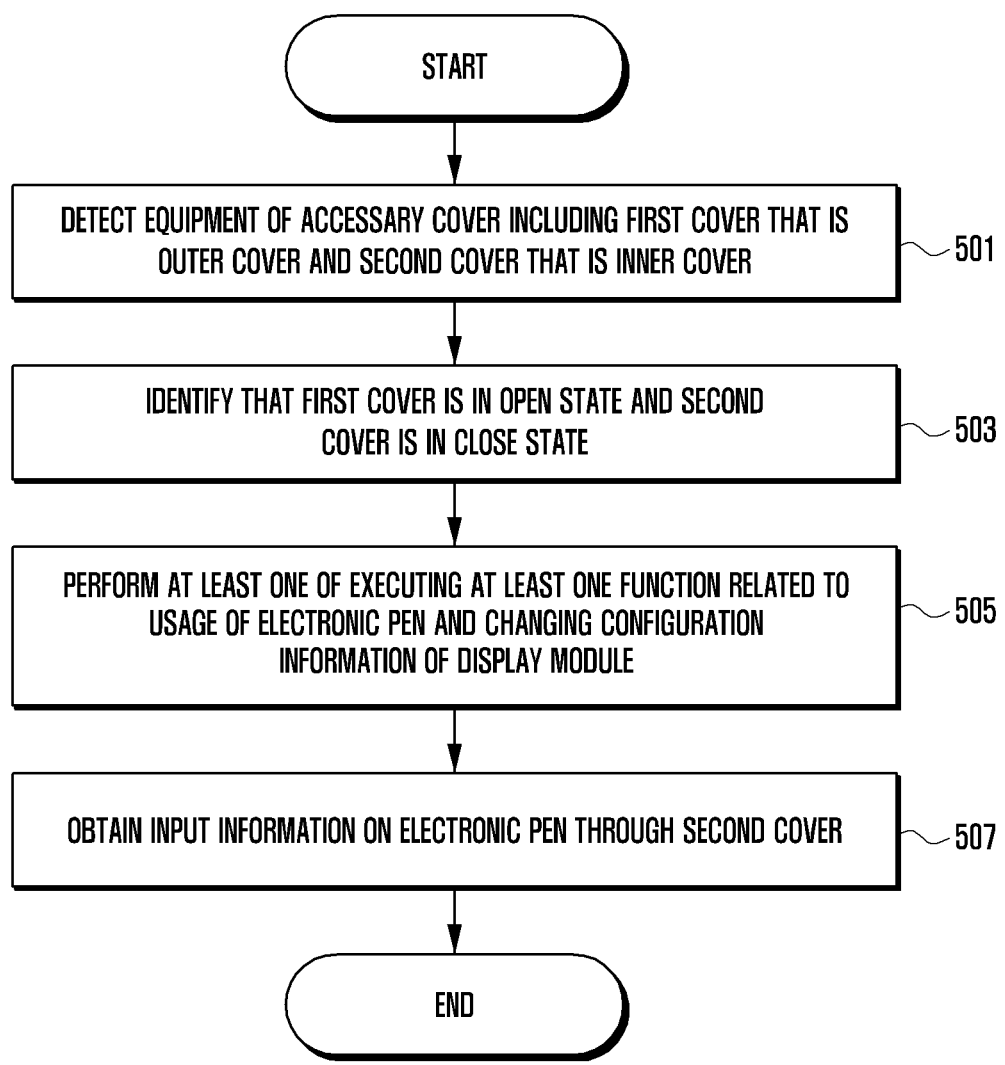
FIG. 5 is a flowchart illustrating a processing method depending on whether an inner cover is attached to an electronic device equipped with an accessory cover according to various embodiments.

FIG. 5 is a flowchart illustrating a processing method depending on whether an inner cover (e.g., third cover 225 of FIG. 2) is attached in an electronic device equipped with an accessory cover according to various embodiments.

According to an embodiment, an electronic device (e.g., electronic device 101 of FIG. 1) may identify an open state and/or a closed state of an outer cover (e.g., second cover 220 of FIG. 2) and/or an inner cover (e.g., third cover 225 of FIG. 2) constituting an accessory cover 200 (e.g., accessory cover 200 of FIG. 2) in a state in which the electronic device is equipped with the accessory cover 200. For example, the outer cover 220 and the inner cover 225 of the accessory cover 200 may include a cover in the form of at least partly covering a display module (e.g., display module 160 of FIG. 1) of the electronic device 101. According to an embodiment, in a state in which the outer cover 220 and the inner cover 225 of the accessory cover 200 are in the closed state together (e.g., first case), the electronic device 101 may operate in a low power mode. For example, the electronic device 101 may be in a sleep mode in which a minimum power is supplied to at least some constituent elements. According to an embodiment, in a state in which the outer cover 220 and the inner cover 225 of the accessory cover 200 are in the open state together (e.g., third case), the electronic device 101 may display a lock screen through the display module 160. In a state in which the outer cover 220 of the accessory cover 200 is in the open state and only the inner cover 225 is in the closed state (e.g., second case), the electronic device 101 may execute at least one function related to the electronic pen, being stored in a memory (e.g., memory 130 of FIG. 1), and/or may change configuration information on the display module 160. In the above-described second case, the electronic device 101 may operate in a specific mode for using the electronic pen more efficiently. For example, the user may perform a handwriting input on the inner cover 225 that is in the closed state by using the electronic pen, and may record the handwriting input based on a user interface displayed on the display module 160. According to an embodiment, in the case that the inner cover 225 in the closed state is changed to the open state, or the outer cover 220 in the open state is changed to the closed state, the electronic device may store handwriting input information through the electronic pen in the memory 130, and may restore the configuration information on the display module 160 to the state prior to the specific mode.

In an embodiment, in step 501, the processor (e.g., processor 120 of FIG. 1) of the electronic device 101 may detect the equipment of the accessory cover 200 including the first cover (e.g., second cover 220 of FIG. 2) that is the outer cover and/or the second cover (e.g., third cover 225 of FIG. 2) that is the inner cover. For example, an NFC antenna (e.g., NFC antenna 250 of FIG. 2) may be disposed on the cover (e.g., first cover 210 of FIG. 2) of the accessory cover 200, on which the electronic device 101 is equipped and fixed. The processor 120 may detect the NFC antenna 250 disposed on the accessory cover 200 through a communication module (e.g., communication module 190 of FIG. 1), and may determine whether the electronic device 101 is equipped with the accessory cover 200. For example, in a state in which the NFC antenna 250 is mounted, the electronic device 101 may detect the NFC antenna 250 disposed on the accessory cover 200.

In an embodiment, in step 503, the processor 120 may identify whether the first cover (e.g., outer cover 220) is in the open state and the second cover (e.g., inner cover 225) is in the closed state. For example, on the outer cover 220 and the inner cover 225, at least one magnetic member (e.g., first magnetic member 421 included in the second cover 220 of FIG. 4 and/or second magnetic member 422 included in the third cover 225 of FIG. 4) may be disposed, and the processor 120 may detect the first magnetic member 421 and/or the second magnetic member 422 by using at least one hall sensor (e.g., hall sensor 410 of FIG. 4) included in the sensor module (e.g., sensor module 176 of FIG. 1). The processor 120 may individually identify the respective states (e.g., open state or closed state) of the outer cover 220 and the inner cover 225 by using the sensor module 176. According to an embodiment, the outer cover 220 and the inner cover 225 may include additional magnetic members for maintaining an attachment state therebetween. For example, the additional magnetic members may be disposed at substantially the same locations on the outer cover 220 and the inner cover 225, and may be attached to each other. According to an embodiment, in case that the user changes the outer cover 220 to the open state in a state in which the outer cover 220 and the inner cover 225 of the accessory cover 200 are in the closed state, the outer cover 220 and the inner cover 225 may be changed from the closed state to the open state together, while maintaining the mutual contact state.

According to an embodiment, the processor 120 may detect the magnetic member (e.g., second magnetic member 422 of FIG. 4) disposed on the inner cover 225 (e.g., third cover 225 of FIG. 4) by using the second hall sensor (e.g., second hall sensor 412 of FIG. 4), and may identify that the inner cover 225 is in the closed state. For example, in case that the outer cover 220 is in the open state and the inner cover 225 is in the closed state, the electronic device 101 may operate in an electronic pen mode for using the electronic pen.

In an embodiment, in step 505, the processor 120 may perform at least one of executing at least one function (e.g., note application, electronic pen related program, or electronic pen related menu) related to the usage of the electronic pen, or changing configuration information (e.g., color, brightness (e.g., brightness of color), contrast, balance, saturation, and/or sharpness) of the display module 160. For example, the at least one function may be a program (e.g., electronic pen related program) stored in the memory 130, and may include a function of a memo taking application and/or a function of a painting application. The electronic pen related program may be a program specific to the usage of the electronic pen, and may be predetermined. According to an embodiment, in case of operating in the electronic pen mode, the processor 120 may execute a function related to the usage of the electronic pen, being stored in the memory 130. As another example, the processor 120 may at least partly change the configuration information (e.g., color, brightness (e.g., brightness of color), contrast, balance, saturation, and/or sharpness) on the display module 160. According to an embodiment, when the inner cover 225 of the accessory cover 200 is disposed on the display module 160 (e.g., when the outer cover 220 is in the open state and the inner cover 225 is in the closed state in case of operating in the electronic pen mode), a problem in that resolution of the display module 160 is degraded may occur. According to an embodiment, in case of operating in the electronic pen mode, the processor 120 may at least partly change the configuration information on the display module 160 so that the resolution of the display module 160 is not visually degraded. For example, the processor 120 may set the brightness level of the display module 160 to high, and/or may display content being displayed with higher color and saturation. According to an embodiment, in case of operating in the electronic pen mode, the electronic device 101 may change the configuration information of the display module 160 so that the user is unable to substantially feel the resolution degrade due to the inner cover 225. According to another embodiment, in case of operating in the electronic pen mode, the processor 120 may execute a blue light function.

According to an embodiment, in the electronic pen mode (e.g., the outer cover 220 (e.g., first cover) is in the open state and the inner cover 225 (e.g., second cover) is in the closed state), the processor 120 may perform at least one operation of executing at least one function related to the usage of the electronic pen and/or changing the configuration information on the display module 160.

According to an embodiment, in step 507, the electronic device 101 may obtain input information on the electronic pen through the inner cover 225 (e.g., second cover). For example, the user may take a memo or draw a picture on the inner cover 225, and the electronic device 101 may obtain handwriting input information by the electronic pen through the inner cover 225.

According to an embodiment, after performing the operation in step 507, the electronic device 101 may identify the states (e.g., open state and/or closed state) of the outer cover 220 and the inner cover 225, and may perform an additional operation depending on the result of the identification.

According to an embodiment, the processor 120 may identify whether the inner cover 225 in the closed state has been changed to the open state. For example, the processor 120 may periodically detect the magnetic member (e.g., second magnetic member 422 of FIG. 4) disposed on the inner cover 225, and may determine whether the inner cover 225 has been changed from the closed state to the open state. In the case that the inner cover 225 is changed from the closed state to the open state, the processor 120 may store the input information obtained in step 507 in the memory 130. For example, the electronic device 101 may be changed from the electronic pen mode to the normal mode for detecting a touch input of a hand, and may store the handwriting input information input by using the electronic pen in the memory 130. According to another embodiment, when being changed from the electronic pen mode to the normal mode, the electronic device 101 may end the program (e.g., application) executed in the electronic pen mode. According to another embodiment, the processor 120 may store the input information obtained in step 507 in the memory 130 in response to the end of the program. According to another embodiment, the electronic device 101 may enter the normal mode in which the inner cover 225 and the outer cover 220 are all in the open state. The processor 120 may display a lock screen through the display module 160.

According to an embodiment, the processor 120 may identify whether the outer cover in the open state has been changed to the closed state. For example, if the outer cover 220 is changed from the open state to the closed state while the inner cover 225 maintains the closed state, the electronic device 101 may be changed from the electronic pen mode to the low power mode. In the case that the outer cover 220 is changed from the open state to the closed state, the processor 120 may store the input information obtained in the electronic pen mode in the memory 130. The processor 120 may be changed from the electronic pen mode to the low power mode.

Figure 6:
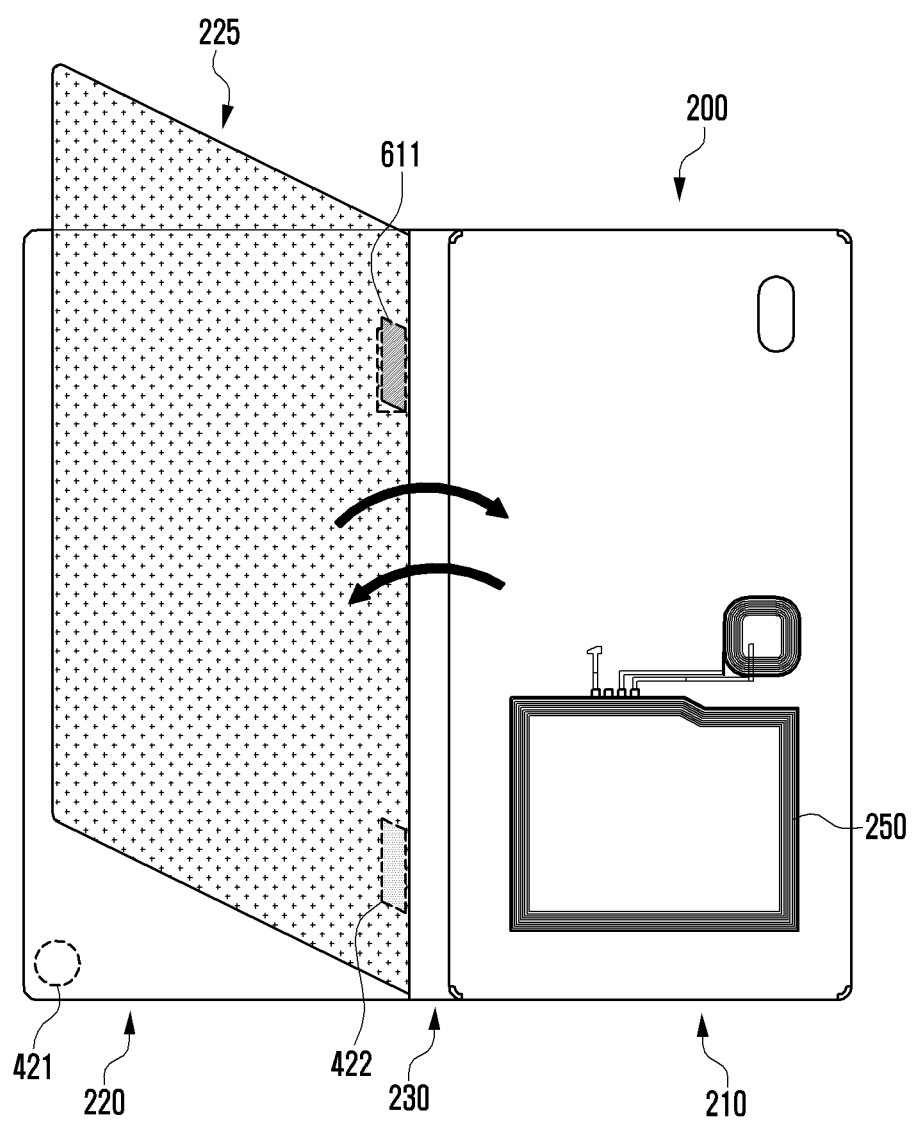
FIG. 6 is an plan view of an accessory cover including an outer cover and an inner cover according to various embodiments.

FIG. 6 is an plan view of an accessory cover including an outer cover 220 and an inner cover 225 according to various embodiments.

In accordance with an embodiment and with reference to FIG. 6, an accessory cover 200 may include a first cover 210 (e.g., rear cover), a second cover 220 (e.g., front cover), a third cover 225 (e.g., inner cover), and a connection part 230 integrally connecting the first cover 210 and the second cover 220 with each other. For example, the third cover 255 may be implemented in the form of being at least partly attached to the connection part 230. According to an embodiment, the electronic device (e.g., electronic device 101 of FIG. 1) may be at least partly attached to the first cover 210, and a side member (e.g., side member 204 of FIG. 2) of the electronic device 101 may be at least partly surrounded by the connection part 230. According to an embodiment, the second cover 220 and the third cover 225 may be formed with substantially the same size, and may operate in an open state and/or a closed state. The second cover 220 and the third cover 225 may be at least partly attached onto a display module (e.g., display module 160 of FIG. 1) of the electronic device 101. For example, when the second cover 220 and the third cover 225 are closed together, the second cover 220 and the third cover 225 may be in a state of covering the display module 160.

According to an embodiment, an NFC antenna 250 may be at least partly disposed on the first cover 210. In the case that the electronic device 101 is equipped with the first cover 210 of the accessory cover 200, a processor (e.g., processor 120 of FIG. 1) of the electronic device 101 may detect the NFC antenna 250 disposed on the first cover 210, and may identify that the electronic device 101 has been mounted on the accessory cover 200.

According to an embodiment, a first magnetic member (e.g., first magnetic member 421 of FIG. 4) may be at least partly disposed on the second cover 220, and the location of the first magnetic member 421 may be determined corresponding to the location of a first hall sensor (e.g., first hall sensor 411 of FIG. 4) of the electronic device 101. According to an embodiment, the processor 120 may identify whether the second cover 220 is in the open state or in the closed state by using the first hall sensor 411.

According to an embodiment, a second magnetic member (e.g., second magnetic member 422 of FIG. 4) may be at least partly disposed on the third cover 225, and the location of the second magnetic member 422 may be determined corresponding to the location of a second hall sensor (e.g., second hall sensor 412 of FIG. 4) of the electronic device 101. According to an embodiment, the processor 120 may identify whether the third cover 225 is in the open state or in the closed state by using the second hall sensor 412.

According to an embodiment, the first magnetic member 421 and the second magnetic member 422 may be disposed to be located away from each other by a predetermined distance so that they do not interfere with each other. According to an embodiment, the disposition locations of the first magnetic member 421 and the second magnetic member 422 are not limited to specific locations.

According to an embodiment, the second cover 220 and the third cover 225 may include additional magnetic members 611 disposed at substantially the same locations. For example, the second cover 220 and the third cover 225 may maintain a mutual attachment state based on the additional magnetic members 611. According to an embodiment, the disposition locations of the additional magnetic members 611 are not limited to specific locations.

According to an embodiment, the second cover 220 and the third cover 225 may maintain the mutual attachment state by the additional magnetic members 611. For example, when the user changes the second cover 220 from the closed state to the open state, the third cover 225 that is attached to the second cover 220 may also be changed from the closed state to the open state.

According to an embodiment, the processor 120 may identify the states (e.g., open state and/or closed state) of the second cover 220 and/or the third cover 225 based on the first magnetic member 421, the second magnetic member 422, and the additional magnetic member 611. For example, the processor 120 may identify at least one of the first case that the second cover 220 and the third cover 225 are all in the closed state, the second case that the second cover 220 is in the open state (e.g., low power mode), and the third cover 225 is in the closed state (e.g., electronic pen mode), and/or the third case that the second cover 220 and the third cover 225 are all in the open state (e.g., normal mode).

According to an embodiment, in the case of operating in the electronic pen mode (e.g., second case), the processor 120 may perform at least one operation of executing at least one function related to the usage of the electronic pen, or changing the configuration information on the display module 160.

Figure 7A:
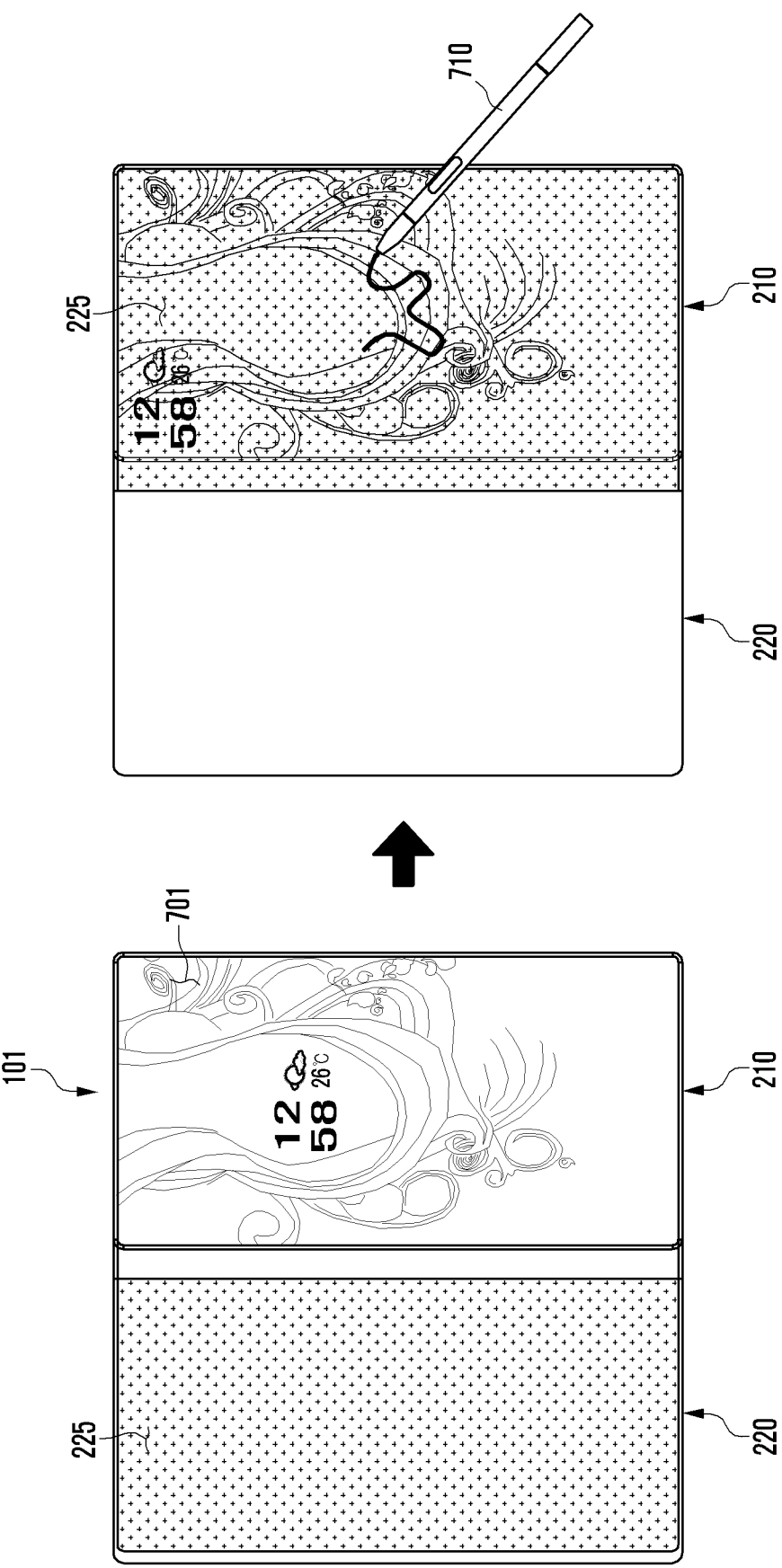
FIG. 7A is a plan view showing an embodiment of changing configuration for a display in case that an inner cover of an accessory cover is attached to a display module of an electronic device according to various embodiments.
Figure 7B:
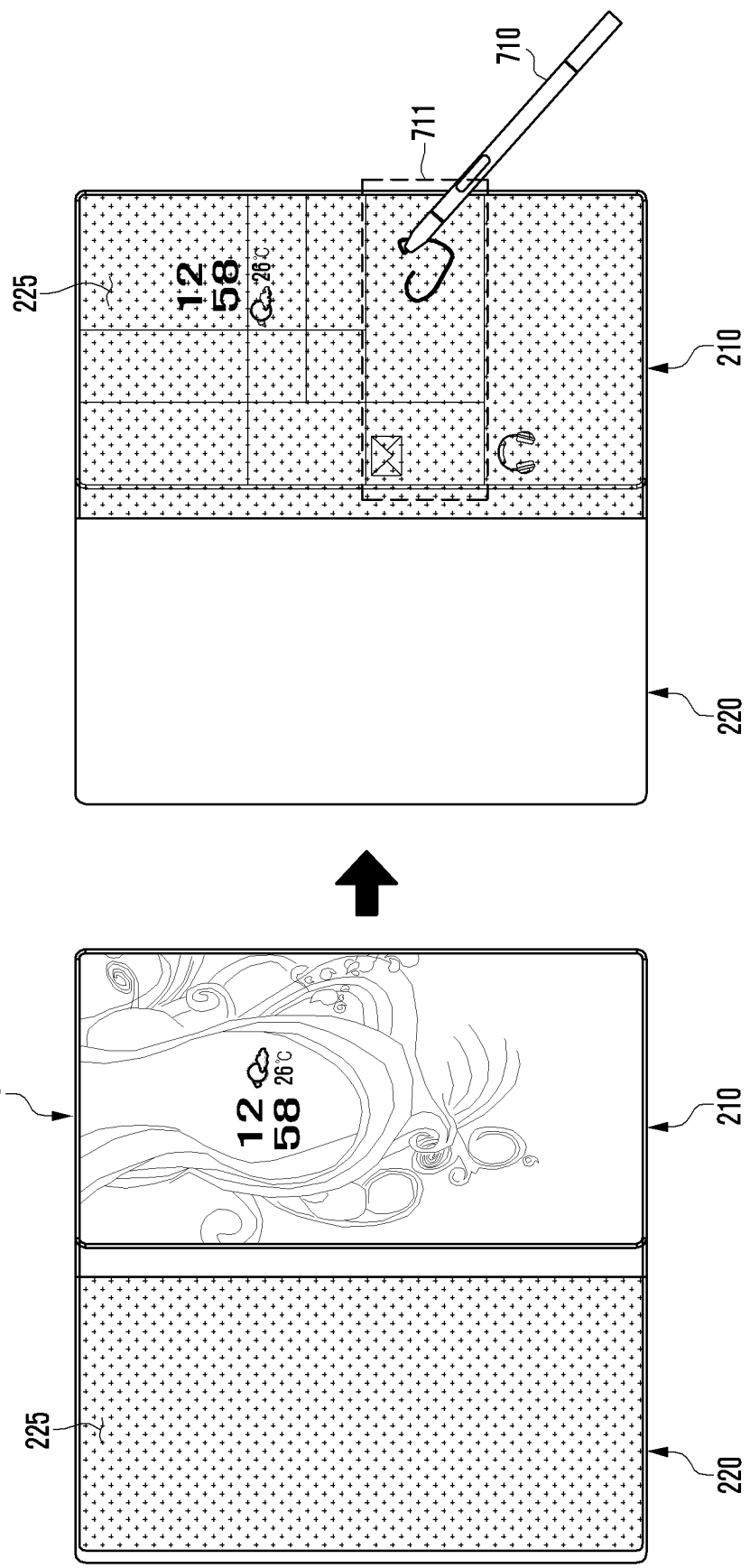
FIG. 7B is a plan view showing an embodiment of executing an application related to an electronic pen in case that an inner cover of an accessory cover is attached to a display module of an electronic device according to various embodiments.

FIG. 7A illustrates an embodiment of changing configuration for a display in the case that an inner cover 225 of an accessory cover 200 is attached to a display module 160 of an electronic device 101 according to various embodiments. FIG. 7B illustrates an embodiment of executing an application related to an electronic pen in case that an inner cover 225 of an accessory cover 200 is attached to a display module 160 of an electronic device 101 according to various embodiments.

In an embodiment and with reference to FIGS. 7A and 7B, a state that an electronic device (e.g., electronic device 101 of FIG. 1) is equipped with an accessory cover (e.g., accessory cover 200 of FIG. 2) is illustrated. With reference to FIGS. 7A and 7B, when an outer cover (e.g., second cover 220 of FIG. 2) and an inner cover (e.g., third cover 225 of FIG. 2) included in the accessory cover 200 are in an open state, the electronic device 101 may display a lock screen 701 through a display module (e.g., display module 160 of FIG. 1) when the outer cover (e.g., second cover 220 of FIG. 2) and the inner cover (e.g., third cover 225 of FIG. 2) included in the accessory cover 200 are in the open state. For example, the lock screen 701 may include at least one piece of information, such as a clock and/or weather. Then the outer cover 220 and the inner cover 225 are all in the open state, the electronic device 101 may operate in a normal mode in which at least one constituent element is activated.

In an embodiment and with reference to FIGS. 7A and 7B, at least one magnetic member (e.g., second magnetic member 422 of FIG. 4) may be disposed on the inner cover 225, and the electronic device 101 may detect the magnetic member disposed on the inner cover 225 by using at least one hall sensor (e.g., second hall sensor 412 of FIG. 4). For example, the processor 120 may identify the proximity of the magnetic member through the at least one hall sensor, and in this case, the processor 120 may identify that the inner cover 225 has been changed from the open state to the closed state.

In an embodiment and with reference to FIG. 7A, when the inner cover 225 is changed from the open state to the closed state, the electronic device 101 may at least partly change configuration information on the display module 160. According to an embodiment, the inner cover 225 may have a paper texture (e.g., haze texture), and may be implemented by a material having improved handwriting feelings for an electronic pen 710. For example, the inner cover 225 may be transparently implemented and constructed from at least one of thermos plastic polyurethane (TPU), polycarbonate (PC), and silicone. In the case that the inner cover 225 is attached to the display module 160 although it is transparently produced, the resolution of the display module 160 may be degraded at least partly. According to an embodiment, in the case that the inner cover 225 is disposed on the display module 160 of the electronic device 101, a processor (e.g., processor 120 of FIG. 1) of the electronic device 101 may at least partly change configuration information of the display module 160 so that the resolution of the display module 160 is not visually degraded. For example, the processor 120 may set the screen brightness to be brighter. According to an embodiment, the inner cover 225 is a cover configured to improve the handwriting feelings for the electronic pen 710, and in the case that only the inner cover 225 is in the closed state, the electronic device 101 may enter an electronic pen mode.

In an embodiment and with reference to FIG. 7A, the electronic device 101 may detect a situation in which the inner cover 225 is changed from the open state to the closed state in the case of operating in a normal mode, and the electronic device 101 in the normal mode may enter an electronic pen mode. According to an embodiment, in the case of entering the electronic pen mode, the electronic device 101 may change the configuration information (e.g., color, brightness (e.g., brightness of color), contrast, balance, saturation, and/or sharpness) of the display module 160 so that convenience in accordance with the usage of the electronic pen 710 is increased.

In an embodiment and with reference to FIG. 7B, the electronic device 101 may detect a situation in which the inner cover 225 is changed from the open state to the closed state in the case of operating in a normal mode, and the electronic device 101 in the normal mode may enter an electronic pen mode. According to an embodiment, in the case of entering the electronic pen mode, the electronic device 101 may execute an application related to the usage of the electronic pen 710. For example, the application may include a memo taking application and/or a painting application. With reference to FIG. 7B, the processor 120 may display a memo area 711 in accordance with the execution of the application, and may obtain an handwriting input through the electronic pen 710.

Figure 8A:
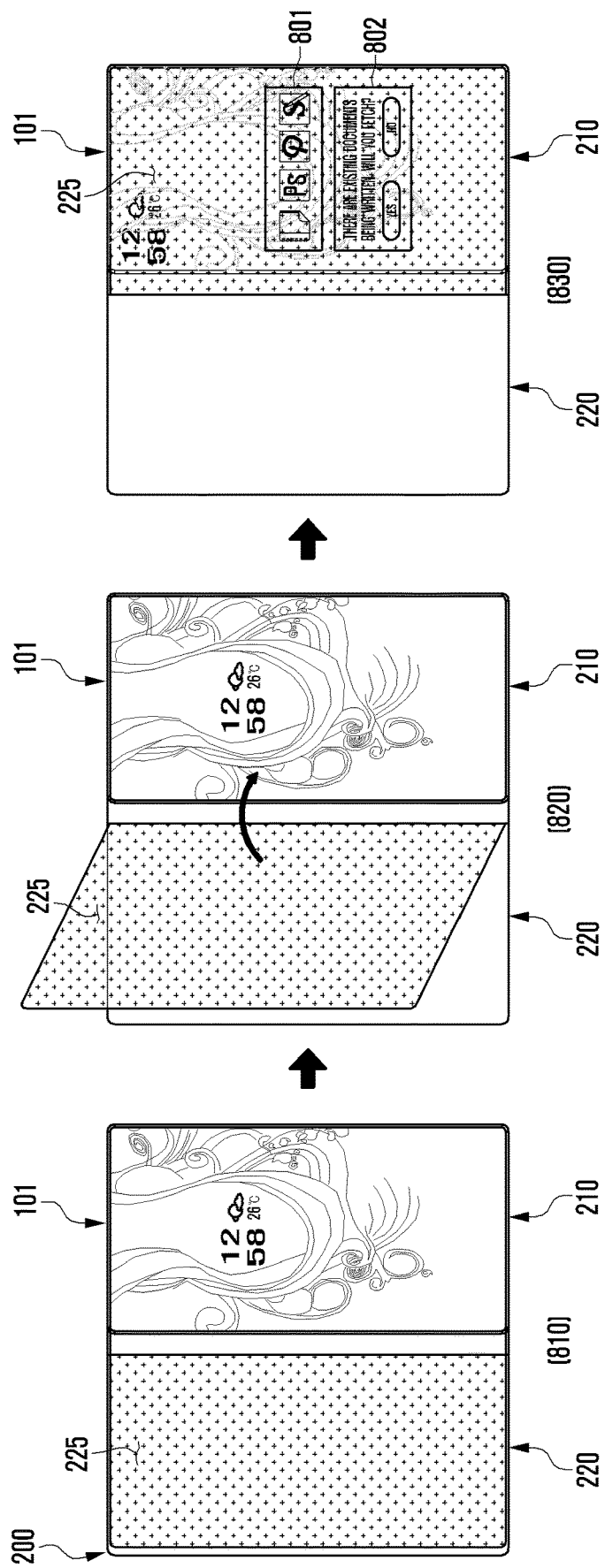
FIG. 8A is a plan view showing an embodiment of displaying at least one application configured in case that an inner cover of an accessory cover is attached to a display of an electronic device according to various embodiments.

FIG. 8A illustrates an embodiment of displaying at least one application configured in the case that an inner cover 225 of an accessory cover 200 is attached to a display of an electronic device 101 according to various embodiments.

In an embodiment and with reference to FIG. 8A, a process in which an inner cover (e.g., third cover 225 of FIG. 2) is changed from an open state to a closed state in a state in which an electronic device (e.g., electronic device 101 of FIG. 1) is equipped with an accessory cover (e.g., accessory cover 200 of FIG. 2) is illustrated through division of the process into three steps (e.g., first step 810, second step 820, and third step 830).

In an embodiment and with reference to the first step 810, in a state in which an outer cover (e.g., second cover 220 of FIG. 2) and an inner cover 225 included in an accessory cover 200 are in an open state together, the electronic device 101 may display a lock screen through a display module (e.g., display module 160 of FIG. 1). For example, the electronic device 101 may operate in a normal mode. According to an embodiment, the outer cover 220 and the inner cover 225 of the accessory cover 220 may be attached to each other by at least one magnetic member.

In an embodiment and with reference to the second step 820, a situation in which the inner cover 225 is changed from an open state to a closed state is illustrated. For example, in a state in which the outer cover 220 and the inner cover 225 are attached to each other through the magnetic member, only the inner cover 225 may be changed from the open state to the closed state. The inner cover 225 may have a paper texture (e.g., haze texture), and may be implemented by a material having improved handwriting feelings for an electronic pen 710 (See FIG. 7B). For example, in the case that a user uses the electronic pen 710, the inner cover 225 may be attached onto the display module 160 of the electronic device 101 (e.g., the inner cover 225 is changed from the open state to the close state), and the electronic pen 710 may be used on the inner cover 225.

In an embodiment and with reference to the third step 830, a processor (e.g., processor 120 of FIG. 1) of the electronic device 101 may detect the magnetic member (e.g., second magnetic member 422 of FIG. 4) disposed on the inner cover 225 through at least one hall sensor (second hall sensor 412 of FIG. 4) included in a sensor module (e.g., sensor module 176 of FIG. 1), and may identify that the inner cover 225 is in the closed state. The processor 120 may display, on the display module 160, at least one application related to the usage of the electronic pen 710 while entering from the normal mode into an electronic pen mode. For example, when the electronic pen 710 is used, at least one application may be determined in order of frequent use based on a usage history of the application being executed. According to an embodiment, in case that the at least one application is executed, a guide message 802 for loading a document previously worked on may be displayed based on the at least one application. According to an embodiment, the electronic device 101 may obtain the handwriting input using the electronic pen 710 through entering the electronic pen mode, and may store the obtained handwriting input in a memory (e.g., memory 130 of FIG. 1) when the mode is changed from the electronic pen mode to another mode.

According to an embodiment, in the case of entering the electronic pen mode, the processor 120 may at least partly change the configuration information on the display module 160. For example, in case that the inner cover 225 is attached onto the display module 160, it may be seen that the resolution of the display module 160 is visually degraded, and the processor 120 may change the configuration information on the display module 160 so that the user is unable to visually feel the resolution degrade for the display module 160. For example, the processor 120 may set the brightness level of the display module 160 to high, and/or may display content being displayed with higher color and saturation. According to another embodiment, the processor 120 may change the configuration information of the display module 160 based on the configuration information of the display module 160 being mainly used by the user in the electronic pen mode.

FIG. 8B illustrates an embodiment of storing a memo being written in the case that an inner cover 225 of an accessory cover 200 is removed from a display of an electronic device 101 according to various embodiments.

In an embodiment and with reference to FIG. 8B, a process in which an inner cover 225 is changed from a closed state to an open state in a state in which an inner cover (e.g., third cover 225 of FIG. 2) of an accessory cover 200 is attached to a display module 160 of an electronic device 101 is illustrated through division of the process into three steps (e.g., fourth step 840, fifth step 850, and sixth step 860). FIG. 8B illustrates an operation process after the third step 830 illustrated in FIG. 8A.

In an embodiment and with reference to the fourth step 840, the electronic device 101 may display an execution screen of at least one application 803 on the display module 160 in response to a selection of the at least one application 803. The at least one application 803 may include an application related to the usage of an electronic pen 710. The electronic device 101 may obtain a handwriting input of the electronic pen 710 through the inner cover 225, and may execute and/or display at least one function corresponding to the handwriting input. According to an embodiment, the inner cover 225 may have a paper texture (e.g., haze texture), and may provide handwriting feelings as if the user uses an actual pen.

In an embodiment and with reference to the fifth step 850, a situation in which the inner cover 225 is changed from the closed state to the open state is illustrated. For example, the inner cover 225 may get away from the display module 160, and the outer cover 220 and the inner cover 225 may be attached to each other through the magnetic members disposed on the outer cover 220 and the inner cover 225. According to an embodiment, the electronic device 101 may be changed from the electronic pen mode to the normal mode, and may store handwriting information input through the electronic pen 710 in the memory 130. The electronic device 101 may display a notification message 804 for notifying that the handwriting information is stored in the memory 130.

In an embodiment and with reference to the sixth step 860, the electronic device 101 may display a lock screen through the display module 160 in a state in which the outer cover 220 and the inner cover 225 are attached to each other. For example, the electronic device 101 may operate in the normal mode.

According to an embodiment, the electronic device 101 may identify the open state and/or the closed state of a plurality of covers (e.g., second cover 220 (outer cover) and/or third cover 225 (inner cover)) included in the accessory cover 200. For example, the electronic device 101 may discriminate and detect the first case that the second cover 220 and the third cover 225 are all in the closed state, the second case that the second cover 220 is in the open state, and only the third cover 225 is in the closed state, and/or the third case that the second cover 220 and the third cover 225 are all in the open state. According to an embodiment, the electronic device 101 may operate in the low power mode in response to the first case, may operate in the electronic pen mode for using the electronic pen in response to the second case, and may operate in the normal mode for a touch input by a hand in response to the third case. According to an embodiment, in the case of operating in the electronic pen mode, the electronic device 101 may execute at least one application (e.g., note application or memo application) related to the usage of the electronic pen 710, and/or at least partly change the configuration information (e.g., color, brightness (e.g., brightness of color), contrast, balance, saturation, and/or sharpness) of the display module 160. For example, in the second case that the display module 160 is covered only by the third cover 225, the resolution of the display module 160 visually shown to the user may be degraded. According to an embodiment, the electronic device 101 may at least partly change the configuration information of the display module 160 so that the resolution of the display module 160 is shown not to be degraded when the third cover 225 is in the closed state. According to an embodiment, the electronic device 101 may store the handwriting information having been inputted by using the electronic pen 710 in the memory 130 when the electronic device 101 is changed from the electronic pen mode to the low power mode or from the electronic pen mode to the normal mode. According to an embodiment, in the case of entering the electronic pen mode, the electronic device 101 may load the handwriting information previously worked on and stored in the memory 130 and may display the loaded handwriting information through the display module 160.

According to an embodiment, the electronic device 101 may operate in the electronic pen mode in response to the second cover 220 (outer cover) in the open state and the third cover 225 (inner cover) in the closed state, and thus may improve convenience in accordance with the usage of the electronic pen 710. The electronic device 101 may automatically execute an application related to the usage of the electronic pen 710, and may at least partly change the configuration information of the display module 160 so as to prevent the resolution of the display module 160 from being degraded.

A method according to various embodiments may include detecting equipment for an accessory cover (e.g., accessory cover 200 of FIG. 2) through a communication module (e.g., communication module 190 of FIG. 1), identifying sensing information on a first cover (e.g., outer cover or second cover 220 of FIG. 4) and a second cover (e.g., inner cover or third cover 225 of FIG. 4) included in the accessory cover 200 by using at least one sensor module (e.g., sensor module 176 of FIG. 1) and changing configuration information on a display module (e.g., display module 160 of FIG. 1) in case that the first cover 220 is in an open state and the second cover 225 is in a closed state based on the identified sensing information.

According to an embodiment, the first cover 220 may include an outer cover configured to protect the display module 160 against an external impact, and the second cover 225 may include an inner cover configured to improve handwriting feelings in case of using an electronic pen 710.

According to an embodiment, the second cover 225 may be transparently implemented based on at least one material of thermos plastic polyurethane (TPU), polycarbonate (PC), and silicone, and may be implemented by injection based on the at least one material so that a surface of the second cover has a paper texture.

According to an embodiment, the at least one sensor module 176 may include a first hall sensor (e.g., first hall sensor 411 of FIG. 4) and a second hall sensor (e.g., second hall sensor 412 of FIG. 4), and identifying the sensing information may include identifying the sensing information on the first cover 220 by using the first hall sensor 411, and identifying the sensing information on the second cover 225 by using the second hall sensor 412.

According to an embodiment, a first magnetic member 421 may be disposed on the first cover 220 corresponding to the first hall sensor 411, and a second magnetic member 422 may be disposed on the second cover 225 corresponding to the second hall sensor 412.

According to an embodiment, the configuration information on the display module 160 may include at least one of color, brightness, contrast, balance, saturation, and sharpness of the display module 160.

According to an embodiment, the processor 120 may execute at least one application stored in the memory 130 and related to the usage of the electronic pen 710 in case that the first cover 220 is in the open state and the second cover 225 is in the closed state, and may obtain the handwriting input of the electronic pen through the second cover 225.

According to an embodiment, the method may further include storing the obtained handwriting input in the memory 130 in the case that the first cover 220 is changed to the close state in a state in which the first cover 220 is in the open state and the second cover 225 is in the close state and storing the obtained handwriting input in the memory 130 in the case that the second cover 225 is changed to the open state in a state in which the first cover 220 is in the open state and the second cover 225 is in the closed state.

A method according to various embodiments may include detecting equipment of an accessory cover (e.g., accessory cover 200 of FIG. 2) in an electronic device (e.g., electronic device 101 of FIG. 1), identifying a state of the accessory cover 200, identifying whether an electronic pen (e.g., electronic pen 710 of FIG. 7A) is attached to the accessory cover 200, selecting at least one of a plurality of coils included in a relay coil disposed on the accessory cover 200 based on the state of the accessory cover 200 when the electronic pen 301 is attached to the accessory cover 200 and charging the electronic pen 710 by using the selected at least one coil.

According to an embodiment, identifying the state of the accessory cover 200 may include identifying one of an open state and a closed state of the accessory cover 200 based on a hall sensor disposed on the electronic device 101 and a magnetic member disposed on the accessory cover 200 corresponding to the hall sensor.

According to an embodiment, the relay coil may include a first relay coil for receiving a wireless power supplied from the electronic device 101 and a second relay coil for supplying the wireless power to the electronic pen 301, wherein the first relay coil and the second relay coil may be electrically connected with each other.

According to an embodiment, detecting the equipment of the accessory cover 200 may include detecting whether the electronic device 101 is equipped with the accessory cover 200 based on a coil member disposed on the electronic device 101 and the first relay coil disposed on the accessory cover 200.

According to an embodiment, the second relay coil may include a first coil, a second coil, and/or a third coil, and selecting the at least one coil may include, selecting the second coil when the accessory cover 200 is in the open state and selecting the first coil and the third coil when the accessory cover 200 is in the closed state.

The method according to an embodiment may further include disposing the electronic device 101 on an external electronic device at least partly in a state in which the electronic device 101 is equipped with the accessory cover 200, receiving a wireless power being supplied from the external electronic device and charging the battery (e.g., battery 189 of FIG. 1) of the electronic device 101 by using the wireless power.

The method according to an embodiment may further include supplying a charging power to the relay coil of the accessory cover 200 while charging the battery 189 by using the wireless power supplied from the external electronic device and charging the electronic pen 710 by using the supplied charging power.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Accordingly, the scope of the various embodiments of the disclosure should be interpreted to include, in addition to the embodiments disclosed herein, all alterations or modifications derived from the technical ideas of the various embodiments of the disclosure. Moreover, the embodiment or parts of the embodiments may be combined in whole or in part without departing from the scope of the disclosure.

The invention claimed is:

1. An electronic device comprising:
   a communication module configured for communication with an accessory cover including a first cover and a second cover;
   at least one sensor module;
   a display module;
   a memory; and
   a processor operatively connected to the communication module, the at least one sensor module, the display module, and the memory,
   wherein the processor is configured to:
      detect equipment for the accessory cover through the communication module,
      identify sensing information on the first cover and the second cover by using the at least one sensor module, and
      in the case that the first cover is in an open state and the second cover is in a closed state, change configuration information on the display module based on the sensing information.

2. The electronic device of claim 1,
wherein the first cover includes an outer cover configured to protect the display module against an external impact, and
wherein, in the case of using an electronic pen, the second cover includes an inner cover configured to improve handwriting feelings.

3. The electronic device of claim 1,
wherein the second cover is transparently implemented and constructed from at least one material of thermos plastic polyurethane (TPU), polycarbonate (PC), and silicone.

4. The electronic device of claim 3,
wherein the second cover is implemented by injection and constructed from a material that causes a surface of the second cover to have a paper texture.

5. The electronic device of claim 1, wherein the at least one sensor module further comprises,
a first hall sensor and a second hall sensor,
wherein the processor is configured to:
identify the sensing information on the first cover by using the first hall sensor, and
identify the sensing information on the second cover by using the second hall sensor.

6. The electronic device of claim 5,
wherein a first magnetic member is disposed on the first cover corresponding to the first hall sensor, and a second magnetic member is disposed on the second cover corresponding to the second hall sensor.

7. The electronic device of claim 1, wherein additional magnetic members are disposed at locations corresponding to the first cover and the second cover so that the first cover and the second cover are magnetically attachable to each other.

8. The electronic device of claim 1, wherein the configuration information on the display module includes at least one of color, brightness, contrast, balance, saturation, and sharpness of the display module.

9. The electronic device of claim 1, wherein the processor is configured to:
in the case that the first cover is in the open state and the second cover is in the closed state, execute at least one application stored in the memory related to usage of an electronic pen, and
obtain a handwriting input of the electronic pen through the second cover.

10. The electronic device of claim 9, wherein the processor is configured to:
store the obtained handwriting input in the memory in the case that the first cover is changed to the closed state in a state in which the first cover is in the open state and the second cover is in the closed state.

11. The electronic device of claim 9,
store the obtained handwriting input in the memory, and display a lock screen through the display module in the case that the second cover is changed to the open state in a state in which the first cover is in the open state and the second cover is in the closed state.

12. The electronic device of claim 1, wherein the accessory cover further comprises a short-range communication antenna, and
wherein the processor is configured to:
identify the short-range communication antenna through the communication module, and
detect that the short-range communication antenna has been mounted on the accessory cover.

13. A method comprising:
detecting equipment for an accessory cover using a communication module;
identifying sensing information on a first cover and a second cover included in the accessory cover by using at least one sensor module; and
changing configuration information on a display module in the case that the first cover is in an open state and the second cover is in a closed state based on the identified sensing information.

14. The method of claim 13,
wherein the first cover includes an outer cover configured to protect the display module against an external impact, and
wherein the second cover includes an inner cover configured to improve handwriting feelings in the case of using an electronic pen.

15. The method of claim 13, wherein the second cover is transparently implemented and is constructed from at least one of thermos plastic polyurethane (TPU), polycarbonate (PC), and silicone, and is implemented by injection and is constructed from a material to cause a surface of the second cover to have a paper texture.

16. The method of claim 13,
wherein the at least one sensor module includes a first hall sensor and a second hall sensor,
wherein identifying the sensing information includes:
identifying the sensing information on the first cover by using the first hall sensor; and
identifying the sensing information on the second cover by using the second hall sensor.

17. The electronic device of claim 16,
wherein a first magnetic member is disposed on the first cover corresponding to the first hall sensor, and a second magnetic member is disposed on the second cover corresponding to the second hall sensor.

18. The electronic device of claim 13, wherein the configuration information on the display module includes at least one of color, brightness, contrast, balance, saturation, and sharpness of the display module.

19. The method of claim 13, further comprising:
executing at least one application stored in a memory and related to usage of an electronic pen in the case that the first cover is in the open state and the second cover is in the closed state; and
obtaining a handwriting input of the electronic pen through the second cover.

20. The method of claim 19, further comprising:
storing the obtained handwriting input in the memory in the case that the first cover is changed to the closed state in a state in which the first cover is in the open state and the second cover is in the closed state; and
storing the obtained handwriting input in the memory, and displaying a lock screen through the display module in the case that the second cover is changed to the open state in a state in which the first cover is in the open state and the second cover is in the closed state.

* * * * *